United States Patent
Ichioka et al.

(10) Patent No.: US 10,730,273 B2
(45) Date of Patent: Aug. 4, 2020

(54) RESIN COMPOSITION, RESIN FILM, SEMICONDUCTOR LAMINATE, METHOD FOR MANUFACTURING SEMICONDUCTOR LAMINATE, AND METHOD FOR MANUFACTURING SEMICONDUCTOR DEVICE

(71) Applicant: SHIN-ETSU CHEMICAL CO., LTD., Tokyo (JP)

(72) Inventors: Yoichiro Ichioka, Annaka (JP); Naoyuki Kushihara, Annaka (JP); Kazunori Kondo, Takasaki (JP); Kazuaki Sumita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 143 days.

(21) Appl. No.: 16/114,569

(22) Filed: Aug. 28, 2018

(65) Prior Publication Data

US 2019/0070837 A1 Mar. 7, 2019

(30) Foreign Application Priority Data

Sep. 7, 2017 (JP) ................................ 2017-172287

(51) Int. Cl.
*B32B 27/26* (2006.01)
*C08K 3/36* (2006.01)
(Continued)

(52) U.S. Cl.
CPC .............. *B32B 27/26* (2013.01); *B32B 27/38* (2013.01); *C08G 59/226* (2013.01);
(Continued)

(58) Field of Classification Search
CPC .......... C08K 5/1515; C08K 3/36; C08K 5/13; C08L 63/10; C08L 83/00; C08L 83/06;
(Continued)

(56) References Cited

U.S. PATENT DOCUMENTS

| 5,248,710 A | 9/1993 | Shiobara et al. |
| 5,585,445 A | 12/1996 | Meguriya et al. |

(Continued)

FOREIGN PATENT DOCUMENTS

| EP | 2 447 304 A1 | 5/2012 |
| EP | 3 091 048 A1 | 11/2016 |

(Continued)

OTHER PUBLICATIONS

Feb. 4, 2019 Extended Search Report issued in European Patent Application No. 18191295.7.

(Continued)

*Primary Examiner* — Peter D. Mulcahy
(74) *Attorney, Agent, or Firm* — Oliff PLC

(57) ABSTRACT

The present invention is a resin composition including: (A) an epoxy resin; (B) an epoxy compound shown by the following formula (1) and/or formula (2); (C) an epoxy compound shown by the following formula (3); (D) a phenolic curing agent; and (E) a curing accelerator,

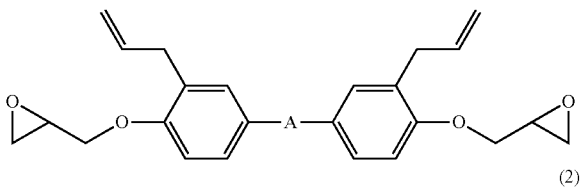

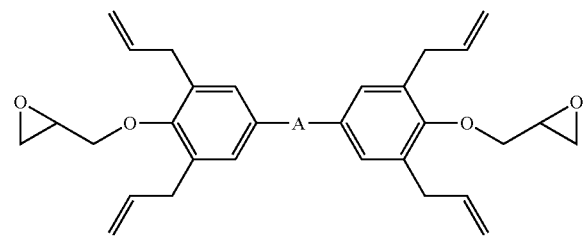

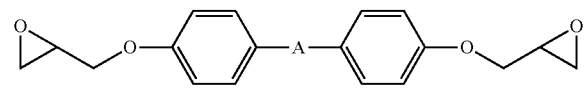

wherein "A" represents a single bond or a divalent organic group selected from the following formulae.

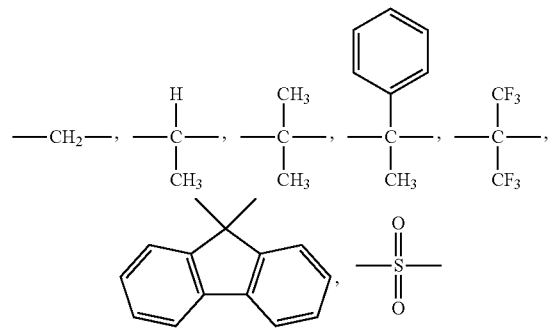

This provides a resin composition with improved strength, reduced warpage, and excellent adhesion, a resin film with improved strength formed from the composition, a semiconductor laminate containing the cured material of the resin film and a method for manufacturing the same, as well as a semiconductor device into which the semiconductor laminate is diced and a method for manufacturing the same.

20 Claims, No Drawings

(51) Int. Cl.

| | | |
|---|---|---|
| *C08L 83/06* | (2006.01) | |
| *H01L 21/02* | (2006.01) | |
| *C08K 5/13* | (2006.01) | |
| *B32B 27/38* | (2006.01) | |
| *C08L 63/10* | (2006.01) | |
| *C08G 77/52* | (2006.01) | |
| *C08L 63/00* | (2006.01) | |
| *C08G 59/22* | (2006.01) | |
| *C08G 59/30* | (2006.01) | |
| *C09D 183/16* | (2006.01) | |
| *C08G 77/60* | (2006.01) | |
| *C08G 59/32* | (2006.01) | |
| *C08G 77/44* | (2006.01) | |
| *C08L 83/00* | (2006.01) | |
| *C08G 77/50* | (2006.01) | |
| *C08K 5/15* | (2006.01) | |
| *H01L 33/56* | (2010.01) | |

(52) U.S. Cl.
CPC ....... *C08G 59/306* (2013.01); *C08G 59/3281* (2013.01); *C08G 77/44* (2013.01); *C08G 77/50* (2013.01); *C08G 77/52* (2013.01); *C08G 77/60* (2013.01); *C08K 3/36* (2013.01); *C08K 5/13* (2013.01); *C08L 63/00* (2013.01); *C08L 63/10* (2013.01); *C08L 83/00* (2013.01); *C08L 83/06* (2013.01); *C09D 183/16* (2013.01); *H01L 21/02126* (2013.01); *B32B 2457/14* (2013.01); *C08L 2312/04* (2013.01); *H01L 33/56* (2013.01)

(58) Field of Classification Search
CPC .... C08G 77/52; C08G 59/226; C08G 59/306; C08G 77/60; C08G 59/3281; C08G 77/44; C08G 77/50; C09D 183/16; H01L 21/02126
See application file for complete search history.

(56) References Cited

U.S. PATENT DOCUMENTS

2012/0108762 A1    5/2012   Kondo et al.
2016/0315025 A1    10/2016  Kondo et al.

FOREIGN PATENT DOCUMENTS

| GB | 2 012 780 A   | 8/1979 |
| JP | 2000-239489 A | 9/2000 |
| JP | 2008-13710 A  | 1/2008 |
| JP | 2012-158730 A | 8/2012 |

OTHER PUBLICATIONS

Jun. 2, 2020 Office Action issued in Japanese Patent Application No. 2017-172287.

RESIN COMPOSITION, RESIN FILM, SEMICONDUCTOR LAMINATE, METHOD FOR MANUFACTURING SEMICONDUCTOR LAMINATE, AND METHOD FOR MANUFACTURING SEMICONDUCTOR DEVICE

TECHNICAL FIELD

The present invention relates to a resin composition, a resin film, a semiconductor laminate, a method for manufacturing a semiconductor laminate, and a method for manufacturing a semiconductor device.

BACKGROUND ART

To cope with miniaturization and cost reduction of mobile computing devices such as smart phones, thinning of silicon wafers to be chip substrates and shifting to larger plastic substrates for improving production efficiency have been investigated recently in the semiconductor industry. In thinner substrates and flexible plastic substrates, however, influence of warpage becomes serious, and accordingly, the strength of encapsulant is important so as not to cause crack in the encapsulant. To improve the strength of encapsulant, various investigations have been carried out using a curing agent including a phenol compound such as bisphenol A and biphenyl or a phenol resin such as a novolak resin and a cresol novolak resin (Patent Literature 1), but encapsulant with more increased strength has been desired. Being flexible, the substrate is liable to bend. In such bending, the end of chip and the lower part of chip are subjected to large stress, and are liable to cause peeling between the encapsulant and the chip or the encapsulant and the substrate. Accordingly, there has been arising necessity to improve adhesion of encapsulant itself and need for decreasing warpage due to cure shrinkage.

In order to improve production efficiency, square substrates are frequently used as the plastic substrate. When such a square plastic substrate is encapsulated, liquid type encapsulant is liable to cause unevenness about the inside and outside of the substrate. To encapsulate this substrate easily and uniformly, film type encapsulant has been desired.

Accordingly, it has been desired to develop a highly adhesive resin composition with improved strength that can reduce warpage and does not cause peeling even in warping, a wafer mold material with excellent property for protecting a wafer using the same, and a film formed from the material, so as not to cause crack in bending.

CITATION LIST

Patent Literature

PATENT LITERATURE 1: Japanese Patent Laid-Open Publication No. 2012-158730

SUMMARY OF THE INVENTION

Technical Problem

The present invention was accomplished in view of the above problems. It is an object of the present invention to provide a resin composition with improved strength and reduced warpage as well as excellent adhesion, a resin film with improved strength formed from the composition, a semiconductor laminate containing the cured material of the resin film and a method for manufacturing the same, as well as a semiconductor device into which the semiconductor laminate is diced and a method for manufacturing the same.

Solution to Problem

To accomplish the object, the present invention provides a resin composition comprising:

(A) an epoxy resin;
(B) an epoxy compound shown by the following formula (1) and/or formula (2);
(C) an epoxy compound shown by the following formula (3);
(D) a phenolic curing agent; and
(E) a curing accelerator,

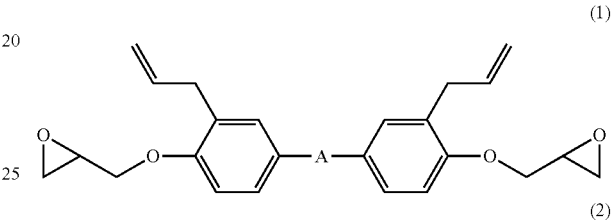

(1)

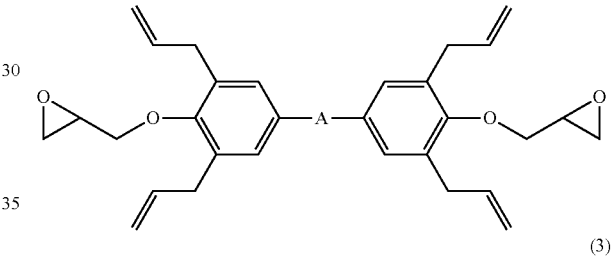

(2)

(3)

wherein "A" represents a single bond or a divalent organic group selected from the following formulae.

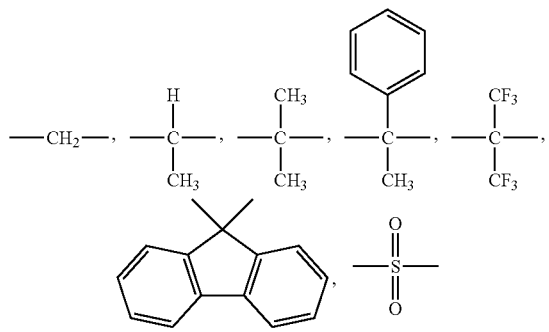

The composition like this gives a cured material with improved strength and reduced warpage as well as excellent adhesion.

It is preferable that the component (A) be a silicone-modified epoxy resin.

As the component (A), a silicone-modified epoxy resin can be exemplified as described above.

In this case, it is preferable that the silicone-modified epoxy resin be shown by the following formula (4) and have a weight-average molecular weight of 3,000 to 500,000, (4)

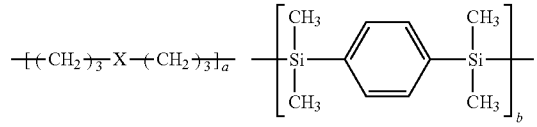

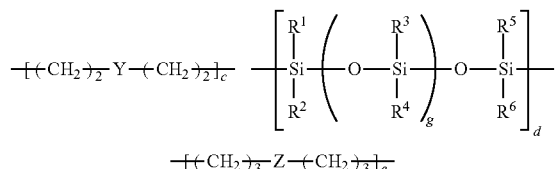

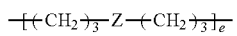

wherein, $R^1$ to $R^6$ each independently represent a monovalent hydrocarbon group or an alkoxy group having 1 to 20 carbon atoms, which is the same or different; "a", "b", "c", "d", and "e" represent a composition ratio of each repeating unit, and are positive numbers satisfying $0<a<1$, $0\leq b<1$, $0\leq c<1$, $0<d<1$, $0\leq e<1$, $0.67\leq(b+d)/(a+c+e)\leq1.67$, and $a+b+c+d+e=1$; "g" is an integer of 0 to 300; X represents a divalent organic group shown by the following formula (5); Y represents a divalent group containing a siloxane skeleton shown by the following formula (6); Z represents a divalent organic group shown by the following formula (7), (5)

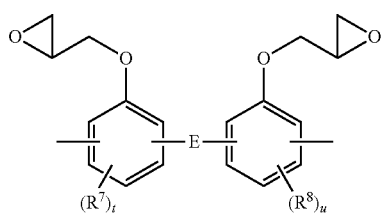

wherein E represents a single bond or a divalent organic group selected from the following formulae,

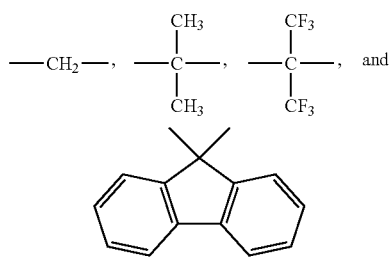

$R^7$ and $R^8$ each represent a monovalent hydrocarbon group or an alkoxy group having 1 to 20 carbon atoms, which is the same or different, "t" and "u" are each independently an integer of 0 to 2;

(6)

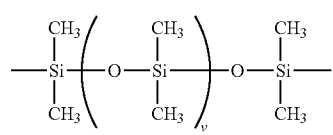

wherein "v" is an integer of 0 to 300;

(7)

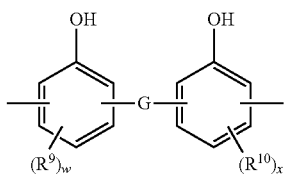

wherein G represents a single bond or a divalent organic group selected from the following formulae,

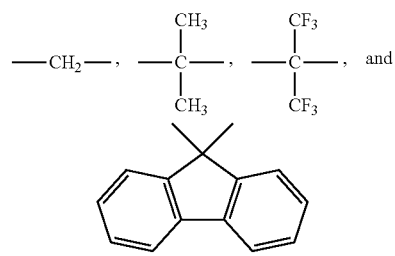

$R^9$ and $R^{10}$ each represent a monovalent hydrocarbon group or an alkoxy group having 1 to 20 carbon atoms, which is the same or different, "w" and "x" are each independently an integer of 0 to 2.

The composition like this is capable of giving a cured material with really excellent chemical resistance, heat resistance, and pressure resistance.

It is preferable that the resin composition exhibit a tensile strength of 6.0 MPa or more after being cured.

The composition like this gives favorable crack resistance.

The component (B) is preferably contained in an amount of 0.5 to 100 parts by mass based on 100 parts by mass of the component (A).

The composition like this is preferable since it sufficiently improves the strength and the adhesion without largely affecting the chemical resistance, modulus of elasticity, and coefficient of linear expansion.

It is preferable that the composition further comprise (F) an inorganic filler.

The composition like this is excellent in wafer protection properties and really excellent in heat resistance, humidity resistance, and strength.

In this case, it is preferable that the inorganic filler be silica and be contained in an amount of 20 to 96 mass % in the resin composition.

The composition like this is preferable since it gives favorable processing characteristics and improved strength.

The present invention further provides a resin film composed of the resin composition of the present invention described above.

The resin film like this acts as a wafer mold material in which various errors are avoidable due to the improved strength and adhesion.

It is preferable that the resin film exhibit a tensile strength of 6.0 MPa or more after being cured.

The resin film like this exhibits favorable crack resistance.

The present invention further provides a semiconductor laminate comprising a cured material of the inventive resin film described above on a semiconductor wafer.

In the semiconductor laminate like this, the resin film has improved strength and adhesion, and the semiconductor wafer is protected sufficiently by the resin film thereby.

The present invention further provides a semiconductor device, characterized in that the inventive semiconductor laminate described above is diced into each piece.

The semiconductor device like this has high quality.

The present invention further provides a method for manufacturing a semiconductor laminate, comprising the steps of:

bonding the inventive resin film described above on a semiconductor wafer to mold the semiconductor wafer; and heat curing of the resin film.

The method for manufacturing a semiconductor laminate like this makes it possible to manufacture a semiconductor laminate in which the semiconductor wafer is protected sufficiently by the resin film.

The present invention further provides a method for manufacturing a semiconductor device, comprising the step of dicing the semiconductor laminate manufactured by the inventive method for manufacturing a semiconductor laminate described above into each piece.

The method for manufacturing a semiconductor device like this makes it possible to manufacture a high quality semiconductor device.

Advantageous Effects of Invention

The inventive resin composition enables the cured material to have largely improved strength. Additionally, the inventive resin composition is excellent in close adhesiveness, reducing warpage, adhesion properties, and wafer protection properties. Accordingly, the inventive resin composition forms a resin film that is usable for wafer level packaging favorably since it is capable of molding a wafer collectively. Use of the invention makes it possible to provide a high quality semiconductor devices in high yield.

DESCRIPTION OF EMBODIMENTS

Hereinafter, the present invention will be described more specifically.

As described above, it has been desired to develop a resin composition with improved strength, reduced tendency for warping, and excellent adhesion, a resin film with improved strength formed from the composition, a semiconductor laminate containing the cured material of the resin film and a method for manufacturing the same, as well as a semiconductor device into which the semiconductor laminate is diced and a method for manufacturing the same.

The present inventors have diligently investigated to solve the above problems. As a result, the present inventors have found that the combination of (A) an epoxy resin, (B) an epoxy compound in a particular structure, (C) an epoxy compound in another particular structure, (D) a phenolic curing agent, and (E) a curing accelerator brings a resin composition that gives a cured material with large tensile strength, improved adhesion, and reduced tendency for warping. The present inventors have additionally found that the film formed from this resin composition acts as a wafer mold material that can be handled more easily; thereby bringing the present invention to completion.

Hereinafter, the embodiments of the present invention will be described specifically, but the present invention is not limited thereto.

Resin Composition

The inventive resin composition contains (A) an epoxy resin, (B) a particular epoxy compound that contains allyl groups, (C) a particular epoxy compound that does not contain an allyl group, (D) a phenolic curing agent, and (E) a curing accelerator.

Component (A)

In the resin composition of the present invention, the component (A) is an epoxy resin. Illustrative examples of the epoxy resin include a bisphenol A type epoxy resin, a bisphenol F type epoxy resin, a bisphenol AD type epoxy resin, a phenol novolak type epoxy resin, a biphenyl type epoxy resin, a naphthalene type epoxy resin, an alicyclic epoxy resin, a glycidyl ester type epoxy resin, a glycidyl amine type epoxy resin, a heterocyclic epoxy resin, a diaryl sulfone type epoxy resin, and a silicone-modified epoxy resin, but are not limited thereto.

As the silicone-modified epoxy resin, the ones shown by the following formula (4) having a weight-average molecular weight of 3,000 to 500,000 is preferable. In this case, the composition containing the silicone-modified epoxy resin gives a cured material with more improved chemical resistance, heat resistance, and pressure resistance.

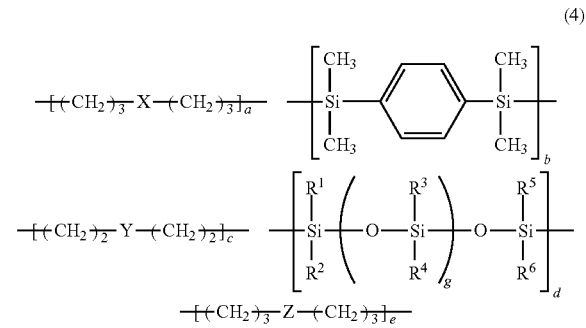

(4)

In the formula (4), $R^1$ to $R^6$ each independently represent a monovalent hydrocarbon group or an alkoxy group having 1 to 20 carbon atoms, and may be the same or different. The monovalent hydrocarbon group is not particularly limited, and is exemplified by a linear, branched, or cyclic alkyl group, an alkenyl group, and an alkynyl group. Each of $R^1$ to $R^6$ is preferably a monovalent hydrocarbon group or an alkoxy group having 1 to 12 carbon atoms, more preferably a monovalent hydrocarbon group or an alkoxy group having 1 to 10 carbon atoms, and particularly preferably a monovalent hydrocarbon group or an alkoxy group having 1 to 6 carbon atoms. Each of $R^1$ to $R^6$ is preferably a methyl group, an ethyl group, a propyl group, a hexyl group, a cyclohexyl group, phenyl group, etc. Among then, a methyl group and a phenyl group are preferable since the raw materials are easily available.

In the formula (4), "a", "b", "c", "d", and "e" represent a composition ratio of each repeating unit, and are positive numbers satisfying $0<a<1$, $0 \le b<1$, $0 \le c<1$, $0<d<1$, $0 \le e<1$, $0.67 \leq (b+d)/(a+c+e) \leq 1.67$, and $a+b+c+d+e=1$. In the formula (4), "g" is an integer of 0 to 300.

In the formula (4), X represents a divalent organic group shown by the following formula (5).

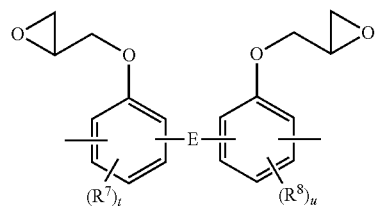
(5)

In the formula, E represents a single bond or a divalent organic group selected from the following formulae.

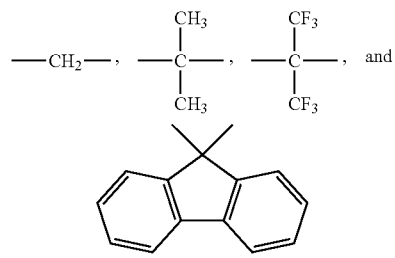

In the formula (4), Y represents a divalent group containing a siloxane skeleton shown by the following formula (6).

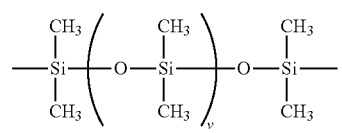
(6)

In the formula, "v" is an integer of 0 to 300.

In the formula (4), Z represents a divalent organic group shown by the following formula (7).

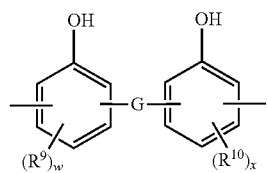
(7)

In the formula, G represents a single bond or a divalent organic group selected from the following formulae.

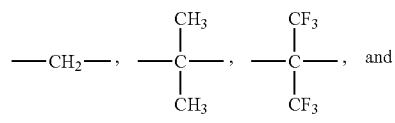

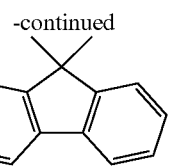

In the formulae (5) and (7), each of $R^7$, $R^8$, $R^9$, and $R^{10}$ represents a monovalent hydrocarbon group or an alkoxy group having 1 to 20 carbon atoms, which may be the same or different. Each of $R^7$ to $R^{10}$ is preferably an alkyl group or an alkoxy group having 1 to 4 carbon atoms, more preferably 1 to 2 carbon atoms. Specifically, a methyl group, an ethyl group, a propyl group, a tert-butyl group, a methoxy group, an ethoxy group, etc. are preferable.

In the formulae (5) and (7), "t", "u", "w", and "x" are each independently an integer of 0 to 2, but are preferably 0.

The silicone-modified epoxy resin shown by the formula (4) has a weight-average molecular weight (Mw) of 3,000 to 500,000, but the weight-average molecular weight is preferably 5,000 to 200,000. The silicone-modified epoxy resin shown by the formula (4) may be either a random copolymer or a block copolymer.

The epoxy resin may be a single substance or a combination of two or more kinds.

The silicone-modified epoxy resin shown by the formula (4) can be produced by the method that will be described below by using a silphenylene compound shown by the following formula (8) and a compound selected from the compounds shown by the following formulae (9) to (12).

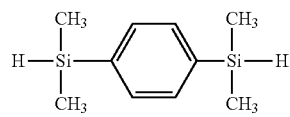
(8)

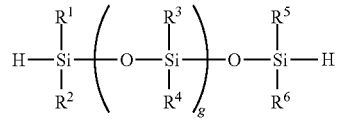
(9)

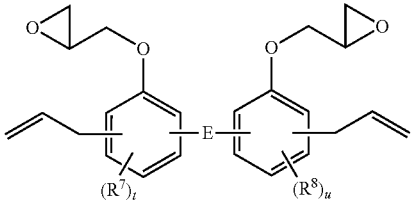
(10)

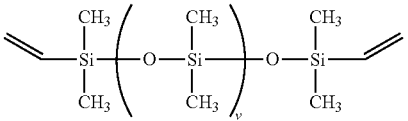
(11)

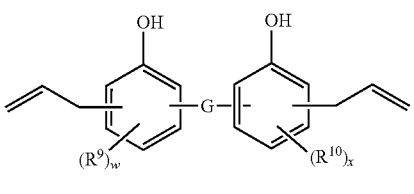
(12)

In the formulae, $R^1$ to $R^{10}$, E, G, "g", "t", "u", "v", "w", and "x" have the same meanings as described above.

The silicone-modified epoxy resin shown by the formula (4) can be synthesized by hydrosilylation of reactants. In this case, it is possible to feed all the reactants into a reaction vessel to perform the reaction; to allow a part of the reactants to react, followed by the reaction of the remained reactants; or to allow the reactants to react one by one; and to select any order of the reactions arbitrary. Each compounds are preferably blended in such an amount that the total molar amount of the hydrosilyl groups of the compounds shown by the formula (8) and the formula (9) to the total molar amount of the alkenyl groups of the compounds shown by the formula (10), the formula (11), and the formula (12) is 0.67 to 1.67, particularly 0.83 to 1.25.

This polymerization reaction is performed in the presence of a catalyst. Any catalysts which are known to promote hydrosilylation may be used. Specifically, palladium complexes, rhodium complexes, and platinum complexes may be used, although the catalyst is not limited thereto. The catalyst is preferably added in an amount of about 0.01 to 10.0 mol % relative to Si—H bond. When the amount is 0.01 mol % or more, the reaction proceeds sufficiently without being retarded. When the amount is 10.0 mol % or less, the dehydrogenation reaction is difficult to proceed to eliminate the risk of retarding the addition reaction.

The polymerization reaction may be performed in a solvent selected from organic solvents that do not interfere with hydrosilylation. Suitable solvents include octane, toluene, tetrahydrofuran, and dioxane, but are not limited thereto. The solvent is preferably used in such an amount as to give a solute concentration of 10 to 70 mass %. When the solute concentration is 10 mass % or more, the reaction system is not too thin, and the reaction proceeds without being retarded. When the solute concentration is 70 mass % or less, the reaction system is not too viscous, preventing the risk of failing to stir the reaction system sufficiently in the middle of the reaction.

The reaction is performed typically at a temperature of 40 to 150° C., preferably 60 to 120° C., particularly 70 to 100° C. When the reaction temperature is 150° C. or less, side reactions such as decomposition are hard to occur. When the reaction temperature is 40° C. or more, the reaction proceeds without being retarded. The reaction time is typically 0.5 to 60 hours, preferably 3 to 24 hours, and particularly 5 to 12 hours.

Component (B)

The component (B) is an epoxy compound shown by the following formulae (1) and/or (2).

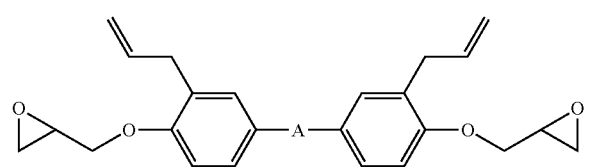

(1)

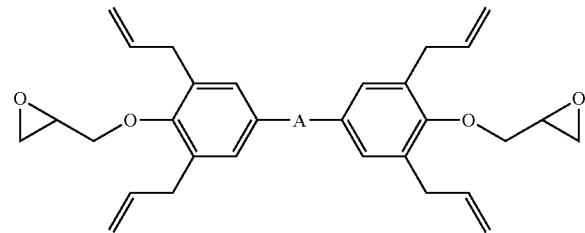

(2)

In the formulae, "A" represents a single bond or a divalent organic group selected from the following formulae.

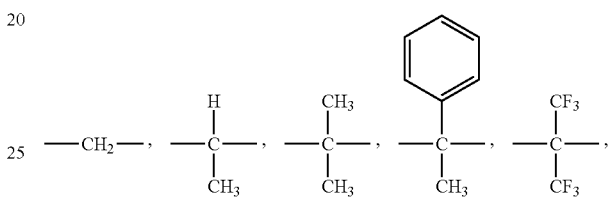

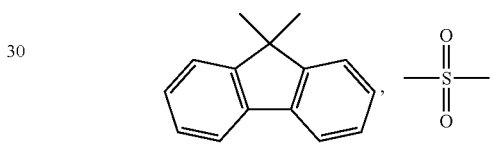

Specifically, the epoxy compounds may be shown by the following structures.

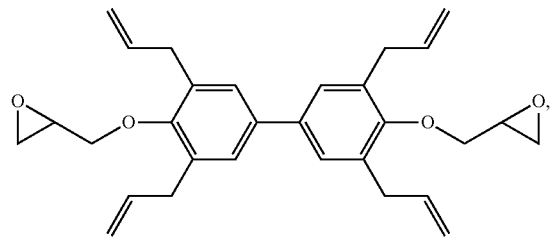

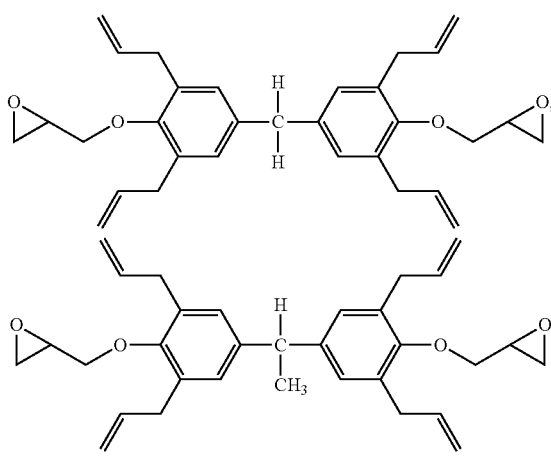

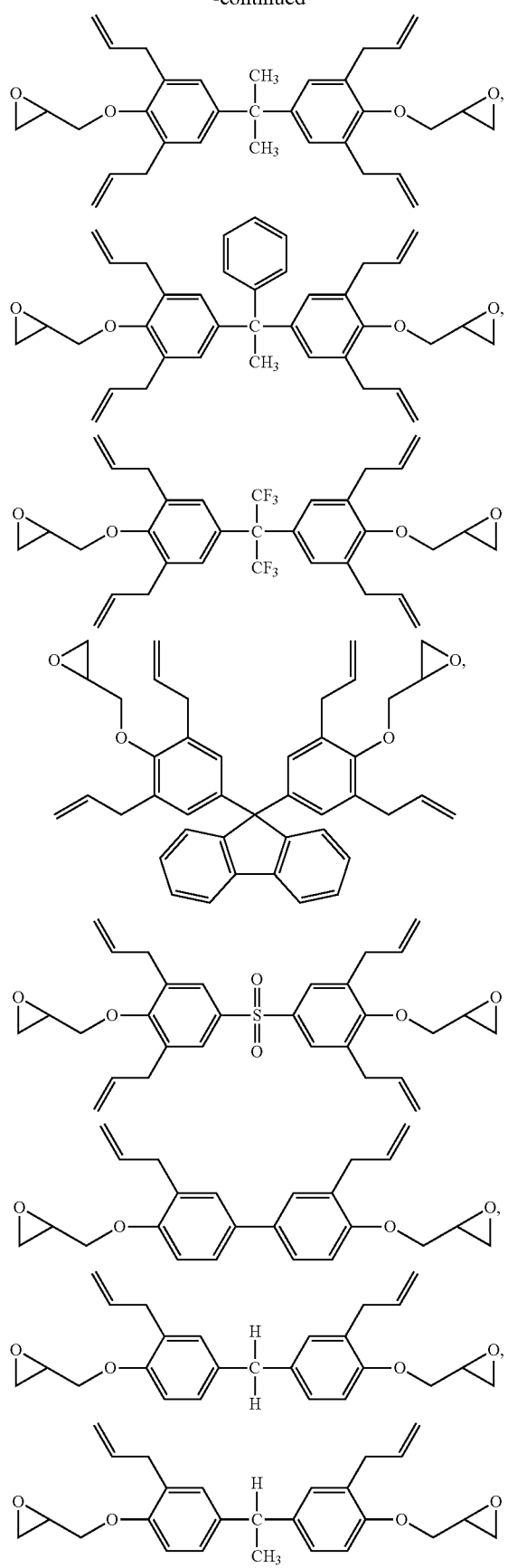
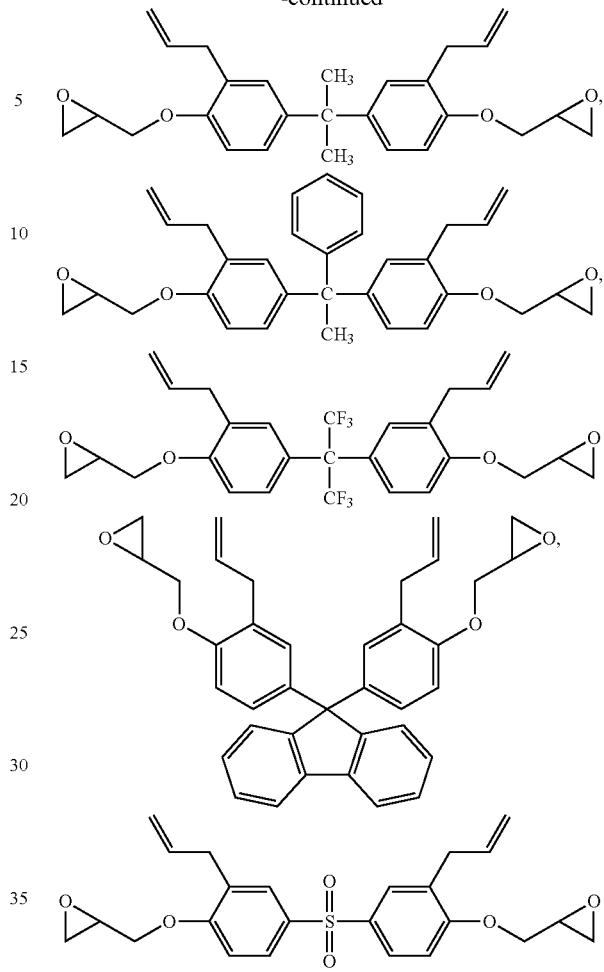

As "A" described above, the following ones are particularly preferable among divalent organic groups.

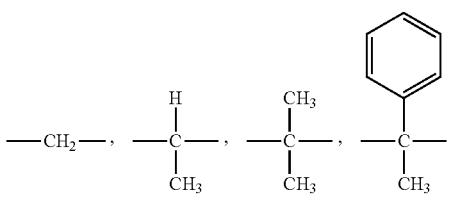

The use of these groups allows the composition to give a cured material with more favorable properties.

Due to π-π interaction of the allyl groups contained in these compounds, the composition is improved in strength. These allyl groups also act to fill the gap between the crosslinks, and accordingly, the cured material is improved in homogeneity to increase the toughness. This makes the composition, when it is used as an encapsulant, be prevented from causing cracks due to warpage of a substrate and peeling. Accordingly, the present invention is usable for a wafer level packaging favorably.

The content of (B) the epoxy compound is preferably 0.5 to 100 parts by mass, more preferably 3 to 50 parts by mass based on 100 parts by mass of the component (A). This content is preferable since it enables the strength and the adhesion to be improved sufficiently when the content of the component (B) is 0.5 parts by mass or more; and the chemical resistance, modulus of elasticity, and coefficient of linear expansion are not largely affected when the content is 100 parts by mass or less.

Component (C)

The component (C) is an epoxy compound shown by the following formula (3).

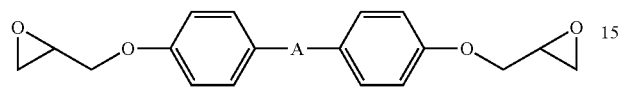

(3)

In the formula, "A" represents a single bond or a divalent organic group selected from the following formulae.

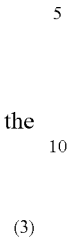

Specifically, the component (C) is represented by the following structures.

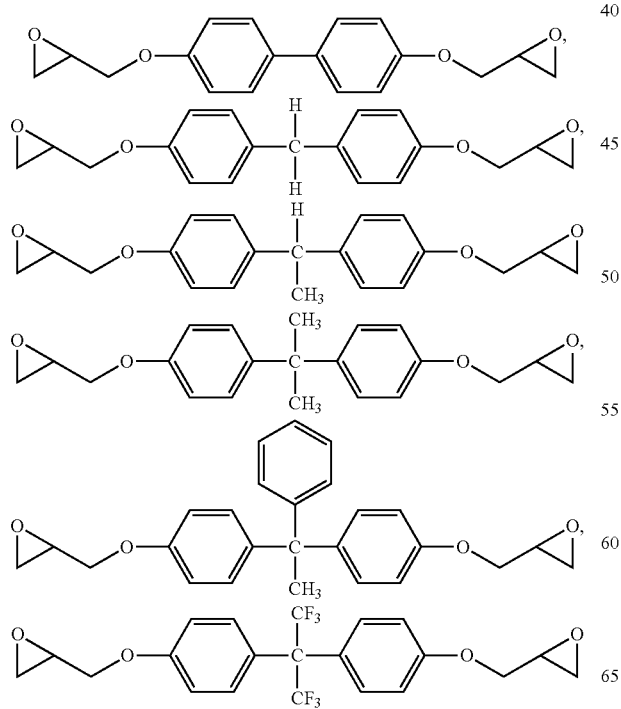

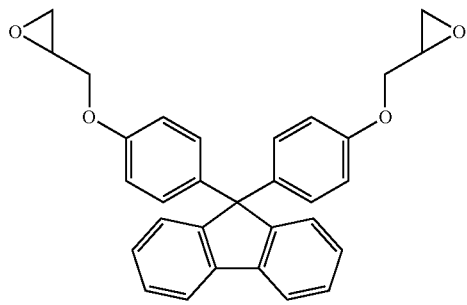

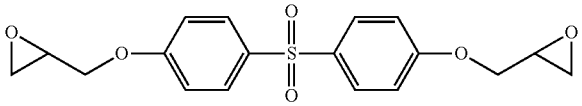

As "A" described above, the following ones are particularly preferable among divalent organic groups.

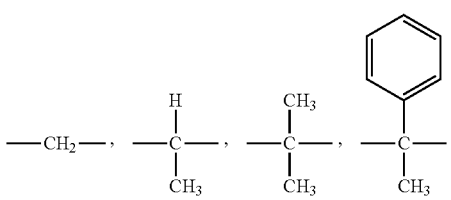

Each of these compounds (C) is incompatible with the component (B), and forms a sea-island structure partly thereby when it is added. When the composition causes stress in curing, the sea-island structure eases the stress, making the whole structure hard to cause warpage. That is, this makes it possible to control warpage of a substrate smaller in the use for encapsulation, thereby being applicable to wafer level packaging.

The content of (C) the epoxy compound is preferably 80 mass % to 120 mass % based on the content of the component (B). The content in the above range allows the component (C) to form an appropriate sea-island structure.

Component (D)

As a phenolic curing agent of the component (D), any known ones are widely usable. Illustrative examples of the structure of the curing agent include the following, but are not limited thereto.

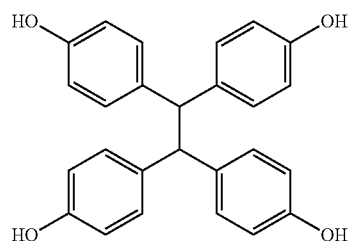

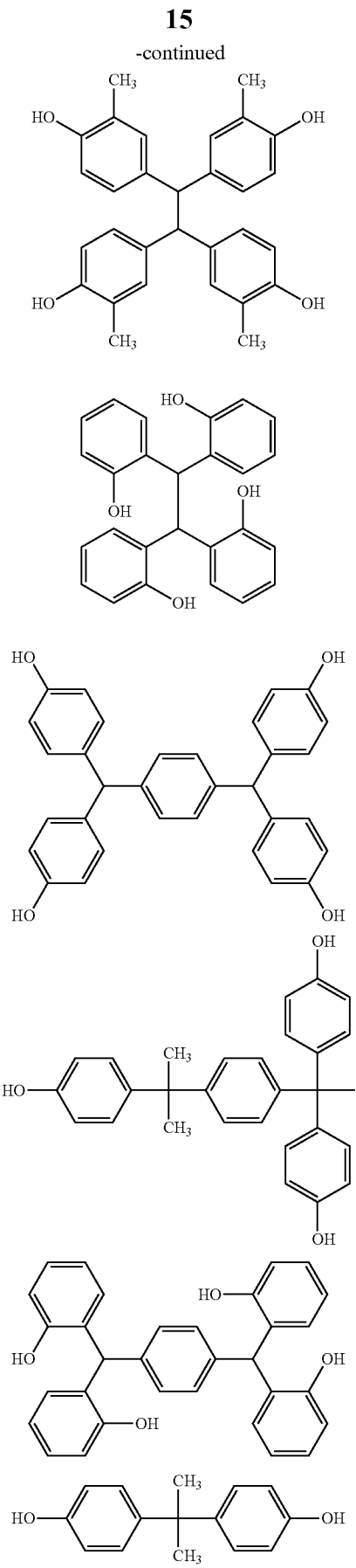

The component (D) is preferably blended such that the equivalent amount of phenolic hydroxy group in the component (D) is 70 mol % to 140 mol %, more preferably 90 mol % to 110 mol % based on the equivalent amount of the epoxy groups in the composition. In this range, the curing reaction proceeds favorably. In the above range, the epoxy groups or the phenolic groups are not to be remained excessively, and the composition scarcely lowers the reliability thereby.

Component (E)

As the curing accelerator of the component (E), any accelerator is usable as long as it is used for ring opening of an epoxy group. Illustrative examples of the curing accelerator include imidazoles such as imidazole, 2-methylimidazole, 2-ethylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 2-phenyl-4,5-dihydroxymethylimidazole, and 2-phenyl-4-methyl-5-hydroxymethylimidazole; tertiary amines such as 2-(dimethylaminomethyl)phenol, triethylenediamine, triethanolamine, 1,8-diazabicyclo [5.4.0]undec-7-ene, and tris(dimethylaminomethyl)phenol; organic phosphines such as diphenyl phosphine, triphenyl phosphine, and tributyl phosphine; metal compounds such as tin octylate; tetrasubstituted phosphonium tetrasubstituted borate such as tetraphenylphosphonium tetraphenylborate and tetraphenylphosphonium ethyltriphenylborate.

The content of the component (E) is preferably 0.05 to 20.0 parts by mass, more preferably 0.5 to 3.0 parts by mass based on 100 parts by mass of the component (A). In this range, the curing reaction proceeds in the proper quantity. When the amount is 0.05 parts by mass or more, the reaction tends to proceed completely. When the amount is 20.0 parts by mass or less, the cured material is prevented from being brittle.

Component (F)

The inventive resin composition may contain an inorganic filler as the component (F) to give wafer protection properties, and to improve the heat resistance, the humidity resistance, the strength, etc. in order to enhance the reliability. The filler may include, for example, a silicate such as talc, calcined clay, uncalcined clay, mica, and glass; oxide such as titanium oxide, alumina, fused silica (fused spherical silica, fused pulverized silica), and powder of crystalline silica; carbonate such as calcium carbonate, magnesium carbonate, and hydrotalcite; hydroxide such as aluminum hydroxide, magnesium hydroxide, and calcium hydroxide; sulfate or sulfite such as barium sulfate, calcium sulfate, and calcium sulfite; borate such as zinc borate, barium metaborate, aluminum borate, calcium borate, and sodium borate; and nitride such as aluminum nitride, boron nitride, and silicon nitride. These inorganic fillers may be used alone, or in combination of two or more kinds. Among them, silica powder including fused silica and crystalline silica are preferable. Illustrative examples of the silica powder include reinforcing silica such as fumed silica and precipitated silica, and crystalline silica such as quartz; specifically, Aerosil (trade mark) R972, R974, and R976 product of NIPPON AEROSIL CO., LTD.; SE-2050, SC-2050, SE-1050, SO-E1, SO-C1, SO-E2, SO-C2, SO-E3, SO-C3, SO-E5, and SO-05 product of Admatechs Company Limited; Musil 120A and Musil 130A product of Shin-Etsu Chemical Co., Ltd.

The average particle size of the inorganic filler is not particularly limited, and is preferably 0.01 to 20 μm, more preferably 0.01 to 10 μm. The inorganic filler having an average particle size of 0.01 μm or more is preferable since the inorganic filler is hard to aggregate, and the strength is enhanced. The average particle size of 20 μm or less is preferable since it enables the resin to improve the fluidity to fill the gap between chips to bring good filling properties. Incidentally, the average particle size can be measured as a mass-average value $D_{50}$ (i.e., a particle size or a median diameter when a cumulative mass is 50%) with a particle size distribution measuring apparatus by a laser diffraction method.

The content of the component (F) is preferably 20 to 96 mass %, more preferably 50 to 96 mass %, particularly preferably 75 to 94 mass % in the solid content of the resin composition. The inorganic filler content of 96 mass % or less brings favorable processing characteristics and improves the strength, thereby being preferable. When the content is 20 mass % or more, sufficient effects can be exhibited. Incidentally, the solid content means components other than the organic solvent.

(G) Organic Solvent

The inventive resin composition may contain an organic solvent as a component (G). Illustrative examples of the organic solvent include N,N-dimethylacetamide, methyl ethyl ketone, N,N-dimethylformamide, cyclohexanone, cyclopentanone, N-methyl-2-pyrrolidone, methanol, ethanol, isopropanol, acetone, propylene glycol monomethyl ether, propylene glycol monomethyl ether acetate, toluene, and xylene; in which methyl ethyl ketone, cyclopentanone, propylene glycol monomethyl ether, and propylene glycol monomethyl ether acetate are particularly preferable; but are not limited thereto. These organic solvent may be used alone, or in combination of two or more kinds. The organic solvent is preferably used in such an amount that the concentration of the solid content in the resin composition is 60 to 90 mass %.

Other Components

The inventive resin composition may contain a flame retardant for the purpose of enhancing flame retardance. The flame retardant is exemplified by phosphorus-based flame retardants, and confers flame retardance without containing halogen atoms. Examples include phosphazene compounds, phosphoric acid ester compounds, and phosphoric acid ester amide compounds. Phosphazene compounds and phosphoric acid ester amide compounds each contain a phosphorus atom and a nitrogen atom in the molecule, thereby bringing a particularly high flame retardance. The flame retardant content is preferably 5 to 30 parts by mass based on 100 parts by mass of the component (A).

The inventive resin composition may contain a silane coupling agent. Containing a silane coupling agent, the resin composition is allowed to further improve the close adhesiveness to an adherend. The silane coupling agent is exemplified by epoxy silane coupling agents and aromatic group-containing aminosilane coupling agents. These may be used alone, or in combination of two or more kinds. The content of silane coupling agent, although not particularly limited, is preferably 0.01 to 5 mass % in the inventive resin composition.

The inventive resin composition may also contain components other than those described above. For example, various additives may be appropriately added to increase the compatibility of the component (A) with the component (B), or to improve various properties such as the storage stability or workability of the resin composition. Illustrative examples of the components that may be added thereto include internal release agents such as fatty acid esters, glyceric acid esters, zinc stearate, and calcium stearate; and phenol, phosphorus or sulfur-based antioxidants. It is also possible to use pigments such as carbon to color the composition.

The other components may be added to the inventive resin composition without using a solvent, but may be added after being dissolved or dispersed to an organic solvent to prepare a solution or dispersion.

The resin composition preferably exhibits a tensile strength of 6.0 MPa or more, particularly in a range of 8.0 to 20.0 MPa after being cured. When the tensile strength is 6.0 MPa or more, it is possible to prevent crack caused by thermal expansion and shrinkage of a substrate or a chip and force applied in mounting a semiconductor package, that is, favorable crack resistance is exhibited.

The inventive composition is capable of molding a wafer (wafer molding) collectively, and has favorable molding properties particularly to a large diameter wafer and a thin wafer. The inventive composition also exhibits improved strength as well as improved adhesion properties and reduced tendency for warping to prevent peeling from a substrate, thereby making it possible to perform molding process favorably, and accordingly, the inventive composition is usable for wafer level packaging suitably.

Additionally, the use of the inventive resin composition allows the stress to be 7.0 to 15.0 MPa after curing, which has been ordinarily 10.0 to 20.0 MPa in conventional resin compositions after being cured. In cured materials in which 88 mass % of filler has been added, the stress can be reduced to about 3.0 to 9.0 MPa in some cases, which has been ordinarily 5.0 to 13.0 MPa in conventional resin compositions. Due to the reduced stress, the package is hard to warp while keeping the tensile strength and elongation almost unchanged. Accordingly, the composition is applicable to a packaging material favorably.

Resin Film

The inventive resin film is a film formed from the inventive resin composition. That is, the inventive resin film is obtained by processing the resin composition described above into a film-form. Being formed into a film-form, the composition acquires good molding properties to a large diameter wafer and a thin wafer, does not cause a problem of short shot on a wafer surface since casting of a resin is unnecessary to collective molding of a wafer. The resin film formed from the resin composition has improved strength and adhesion, and can be a wafer mold material in which various errors hardly occur.

The inventive resin film after curing preferably has a tensile strength of 6.0 MPa or more, more preferably 8.0 to 20.0 MPa. When the tensile strength is 6.0 MPa or more, it is possible to prevent a crack due to thermal expansion and shrinkage of a substrate or a chip and force applied in mounting a semiconductor package, that is, favorable crack resistance is exhibited.

It is desirable that the inventive resin film after curing have elastic modulus of about 150 to 1,500 MPa in a filler-less film, and about 1,000 to 20,000 MPa in a film loaded with filler. When the elastic modulus increases, the package becomes hard to deform, and the protection properties are sometimes improved.

In the present invention, a protective film may be laminated on a resin film obtained from the resin composition described above. The following describes an example of the method for producing the inventive resin film in this case.

A resin composition solution is produced by mixing the components (A) to (E), together with the components (F) and (G) and the other components in case of needs. The resin composition solution is applied onto a protective film to have a desired thickness using a reverse roll coater, comma coater or the like. The protective film onto which the resin composition solution has been coated is passed through an in-line dryer and dried by removing the organic solvent at 80 to 160° C. for 2 to 20 minutes, and then pressure-bonded and laminated with another protective film using a roll laminator, thereby giving a laminate film in which the resin film is formed. This laminate film is used as a wafer mold material to bring favorable molding properties.

In case of forming the inventive resin composition into a film-form, the thickness is not particularly limited, but is preferably 2 mm or less, more preferably 50 μm or more and 1,200 μm or less, further preferably 80 to 850 μm. Such a thickness is preferable since it makes the film excellent in protection properties as a semiconductor encapsulant.

The protective film is not particularly limited, provided it can be peeled without damaging the shape of the resin film made of the inventive resin composition, and functions as a protective film and release film for wafers. Typical examples include plastic films such as polyethylene (PE) films, polypropylene (PP) films, polymethylpentene (TPX) films, and polyester films processed to have releasability. The protective film preferably has a peel strength of 50 to 300 mN/min, and the thickness is preferably 25 to 150 μm, more preferably 38 to 125 μm.

Semiconductor Laminate and Method for Manufacturing the Same

The inventive semiconductor laminate has a cured material of the inventive resin film on a semiconductor wafer. The inventive method for manufacturing a semiconductor laminate is a method involving a step of bonding the resin film described above on a semiconductor wafer to mold the semiconductor wafer, and a step of heat curing of the resin film.

The semiconductor wafer may be a wafer having semiconductor devices (chips) stacked on the surface or a semiconductor wafer having semiconductor devices built on the surface. The inventive resin film exhibits good filling properties on such a wafer surface before molding, together with improved strength and adhesion properties after molding, and is also excellent in protection properties of such wafers. Additionally, the inventive resin film is suitably usable for molding large-diameter wafers having a diameter of 8 inches or more, such as 8-inch (200 mm), 12-inch (300 mm), or even larger diameter wafers, and thin-film wafers. The thin wafer is preferably a wafer processed to a thin-film with a thickness of 5 to 400 μm.

The method for molding a wafer using the inventive resin film is not particularly limited. For example, molding may be performed such that one of protective layers attached to both sides of the resin film is peeled; the resin film having the other protective layer remained thereon is collectively adhered to a wafer using a vacuum laminator manufactured by Takatori Corporation (trade name: TEAM-300) with the vacuum chamber being set to have a degree of vacuum of 50 to 1,000 Pa, preferably 50 to 500 Pa (e.g., 100 Pa), and a temperature of 80 to 200° C., preferably 80 to 130° C. (e.g., 100° C.); after the pressure is returned to normal pressure, the wafer is cooled to room temperature and is taken out of the vacuum laminator, followed by peeling off the other protective layer.

Alternatively, for a wafer on which semiconductor chips have been stacked, preferred use can be made of a compression molding machine or an apparatus equipped with a vacuum diaphragm laminator and a metal plate press for planarization. For example, the apparatus manufactured by Apic Yamada Corporation (trade name: MZ-824-01) may be used as the compression molding machine. A 300 mm silicon wafer having semiconductor chips stacked thereon can be molded at 100 to 180° C., a molding pressure of 100 to 300 kN, a clamping time of 30 to 90 seconds, and a molding time of 5 to 20 minutes.

The apparatus manufactured by Nichigo-Morton Co., Ltd. (trade name: CVP-300) may be used as the apparatus equipped with a vacuum diaphragm laminator and a metal plate press for planarization. Subsequent to lamination under the conditions of a lamination temperature of 100 to 180° C., a degree of vacuum of 50 to 500 Pa, a pressure of 0.1 to 0.9 MPa, and a lamination time of 30 to 300 seconds; the resin molded surface may be planarized between the upper and lower hot plate with a temperature of 100 to 180° C., under the conditions of a pressure of 0.1 to 3.0 MPa, and a pressing time of 30 to 300 seconds.

After the molding, the resin film can be cured by heating the resin film at 120 to 220° C. for 15 to 360 minutes. In this way, the semiconductor laminate can be obtained.

Semiconductor Device and Method for Manufacturing the Same

The inventive semiconductor device is formed by dicing the inventive semiconductor laminate into each piece. The inventive method for manufacturing a semiconductor device involves a step of dicing the semiconductor laminate manufactured by the inventive method for manufacturing a semiconductor laminate into each piece. By dicing a semiconductor wafer molded with the resin film into each piece as described above, a semiconductor device having a heat cured film is obtained. The molded wafer is attached onto a protective tape for semiconductor processing such as dicing tape so as to be in contact with a molded resin surface or a wafer surface, and placed on a vacuum chuck table of a dicer. This molded wafer is cut by using a dicing saw (e.g., DFD6361, product of DISCO Corp.) provided with a dicing blade. The spindle rotation rate and cutting speed of dicing operation may be selected appropriately, and the spindle rotation rate is generally 25,000 to 45,000 rpm, and the cutting speed is generally 10 to 50 mm/sec. The size of a division piece is generally about 2 mm×2 mm to 30 mm×30 mm, although it depends on a semiconductor package design.

In the semiconductor wafer molded with the resin film, the resin film has improved strength and adhesion, thereby making the semiconductor wafer be protected sufficiently. Accordingly, high quality semiconductor devices can be manufactured in good yield by dicing this molded wafer into each pieces.

EXAMPLES

Hereinafter, the present invention will be specifically described by showing synthesis Examples, Examples, and Comparative Examples, but the present invention is not limited to the following Examples.

The following Compounds S-1 to S-8 were used.

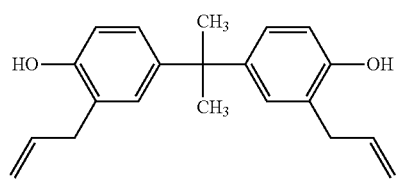
(S-1)

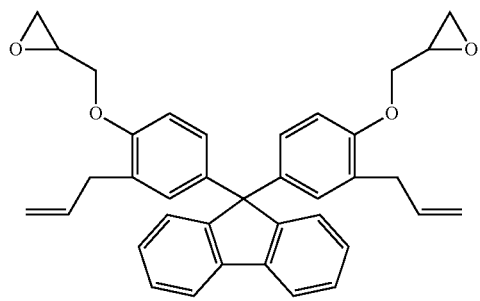
(S-2)

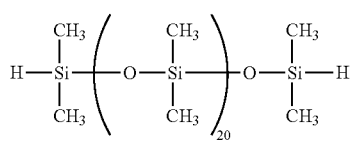
(S-3)

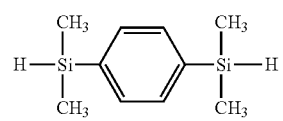
(S-4)

-continued

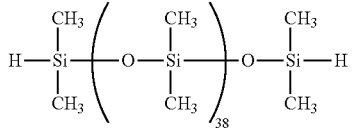
(S-5)

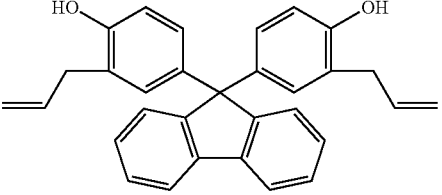
(S-6)

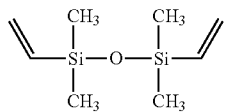
(S-7)

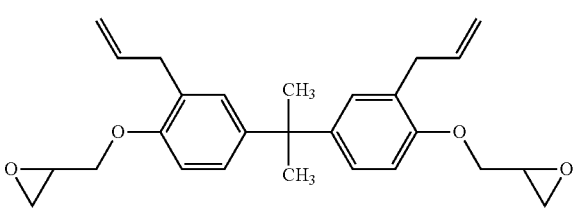
(S-8)

Synthesis Example of Epoxy Compound 1

Into a 5 L flask equipped with a stirrer, a thermometer, a nitrogen inflow instrument, and a reflux condenser, 617 g (2.0 mol) of Compound S-1, 256 g (8.0 mol) of methanol, and 852 g (8.0 mol) of epichlorohydrin were introduced. Then, 768 g (19.2 mol) of sodium hydroxide was added over 2 hours, followed by increasing the temperature to 60° C., and the mixture was allowed to react for 3 hours. After the reaction, 500 mL of toluene was added thereto, and the organic layer was washed with pure water until the water layer became neutral. Subsequently, the solvent in the organic layer was removed under reduced pressure to give 757 g (1.8 mol) of Epoxy compound (1).

Epoxy compound (1)

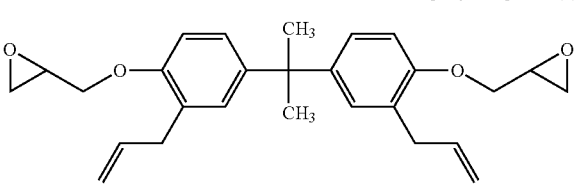

Synthesis Example of Epoxy Compound (2)

Into a 5 L flask equipped with a stirrer, a thermometer, a nitrogen inflow instrument, and a reflux condenser, 617 g (2.0 mol) of Compound S-1, 256 g (8.0 mol) of methanol, and 724 g (8.0 mol) of allyl chloride were introduced. Then, 768 g (19.2 mol) of sodium hydroxide was added over 2 hours with the shape remaining granular. After the completion of addition, the mixture was warmed to 60° C. and allowed to age for 3 hours. Subsequently, 500 mL of toluene was added to the reaction solution, and the organic layer was washed with pure water until the water layer became neutral. Then, the solvent in the organic layer was removed under reduced pressure to give 740 g of a crude product. This was transferred to a 5 L flask equipped with a stirrer, a thermometer, a nitrogen inflow instrument, and a reflux condenser again, and stirred at 180° C. for 4 hours to cause Claisen rearrangement. Subsequently, the temperature was decreased to 45° C., 245 g (7.6 mol) of methanol and 810 g (7.6 mol) of epichlorohydrin were introduced again. Then, 365 g (9.1 mol) of sodium hydroxide was added over 1 hour, followed by increasing the temperature to 60° C., and the mixture was allowed to react for 3 hours. After the reaction, 500 mL of toluene was added thereto, and the organic layer was washed with pure water until the water layer became neutral. Subsequently, the organic solvent in the organic layer was removed under reduced pressure to give 851 g (1.7 mol) of Epoxy compound (2).

Epoxy compound (2)

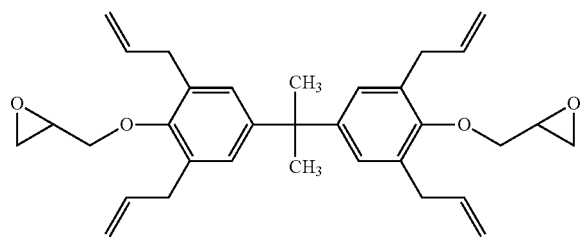

[1] Synthesis of Resins

In the Synthesis Examples, the weight average molecular weight (Mw) was measured by gel permeation chromatography (GPC) in terms of monodispersed polystyrene as a standard by using a GPC column of TSK gel Super HZM-H (product of Tosoh Corporation) under analysis conditions of a flow rate of 0.6 ml/min, an eluting solvent of tetrahydrofuran, and a column temperature of 40° C.

Synthesis Example of Resin 1

Into a 3 L flask equipped with a stirrer, a thermometer, a nitrogen inflow instrument, and a reflux condenser, 195.9 g (0.333 mol) of Compound S-2 was introduced. Then, 1,400 g of toluene was added thereto, and the mixture was heated to 70° C. Subsequently, 1.0 g of solution of chloroplatinic acid in toluene (platinum concentration of 0.5 mass %) was introduced, and 414.9 g (0.267 mol) of Compound S-3 and 13.0 g (0.067 mol) of Compound S-4 were each added dropwise over 1 hour (total molar number of the hydrosilyl groups/total molar number of the alkenyl groups=0.5/0.5=1/1). After completion of the dropwise addition, the mixture was heated to 100° C. and aged for 6 hours. Then, toluene was evaporated from the reaction solution under reduced pressure to give 570 g of Resin 1 shown by the following formula. The Mw of Resin 1 was 37,400. Incidentally, the siloxane amount contained in Resin 1 was 67 mass %.

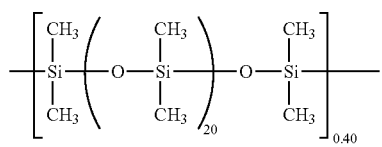

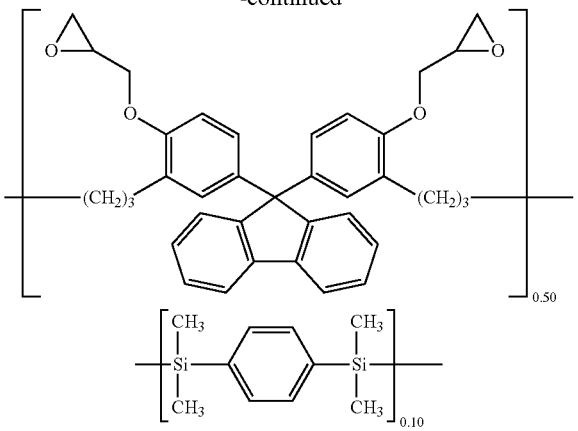

Synthesis Example of Resin 2

Into a 3 L flask equipped with a stirrer, a thermometer, a nitrogen inflow instrument, and a reflux condenser, 133.5 g (0.227 mol) of Compound S-2 was introduced. Then, 1,500 g of toluene was added thereto, and the mixture was heated to 70° C. Subsequently, 1.0 g of solution of chloroplatinic acid in toluene (platinum concentration of 0.5 mass %) was introduced, and 525.6 g (0.182 mol) of Compound S-5 and 8.8 g (0.045 mol) of Compound S-4 were each added dropwise over 1 hour (total molar number of the hydrosilyl groups/total molar number of the alkenyl groups=0.500/0.500=1). After completion of the dropwise addition, the mixture was heated to 100° C. and aged for 6 hours. Then, toluene was evaporated from the reaction solution under reduced pressure to give 605 g of Resin 2 having a structure shown by the following formula. The Mw of Resin 2 was 51,100. Incidentally, the siloxane amount contained in Resin 2 was 79 mass %.

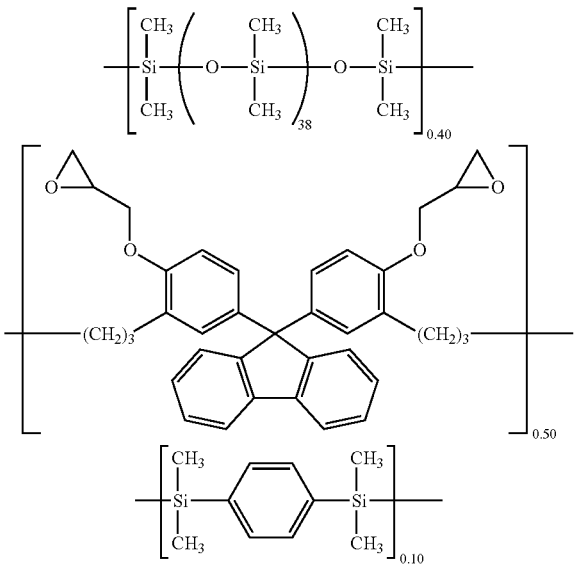

Synthesis Example of Resin 3

Into a 3 L flask equipped with a stirrer, a thermometer, a nitrogen inflow instrument, and a reflux condenser, 104.9 g (0.179 mol) of Compound S-2, 61.5 g (0.143 mol) of Compound S-6, and 6.6 g (0.036 mol) of Compound S-7 were introduced. Then, 1,600 g of toluene was added thereto, and the mixture was heated to 70° C. Subsequently, 1.0 g of solution of chloroplatinic acid in toluene (platinum concentration of 0.5 mass %) was introduced, and 516.3 g (0.179 mol) of Compound S-5 and 34.7 g (0.179 mol) of Compound S-4 were each added dropwise over 1 hour (total molar number of the hydrosilyl groups/total molar number of the alkenyl groups=0.500/0.500=1.00). After completion of the dropwise addition, the mixture was heated to 100° C. and aged for 6 hours. Then, toluene was evaporated from the reaction solution under reduced pressure to give 680 g of Resin 3. The Mw of Resin 3 was 46,800. Incidentally, the siloxane amount contained in Resin 3 was 72 mass %.

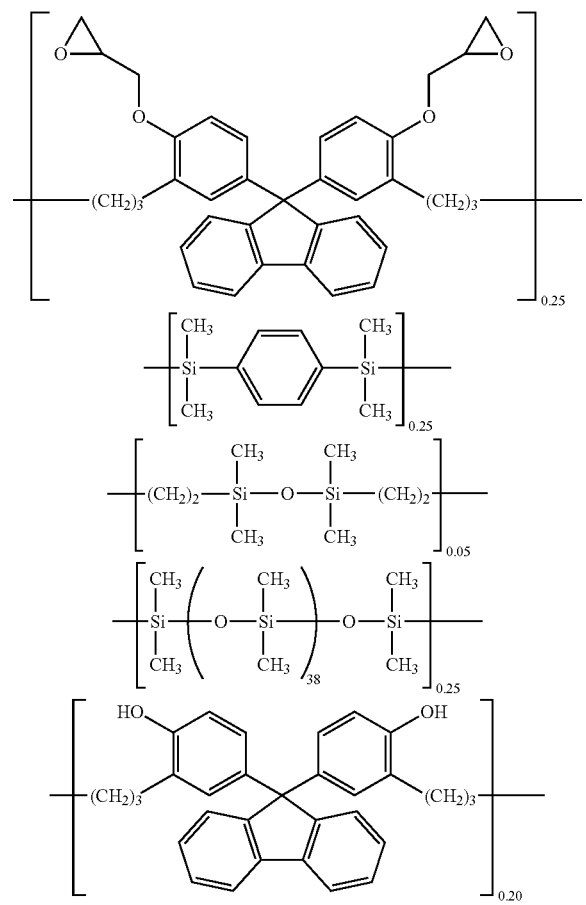

Synthesis Example of Resin 4

Into a 3 L flask equipped with a stirrer, a thermometer, a nitrogen inflow instrument, and a reflux condenser, 140.2 g (0.333 mol) of Compound S-8 was introduced. Then, 1,500 g of toluene was added thereto, and the mixture was heated to 70° C. Subsequently, 1.0 g of solution of chloroplatinic acid in toluene (platinum concentration of 0.5 mass %) was introduced, and 518.7 g (0.333 mol) of Compound S-3 was added dropwise over 1 hour (total molar number of the hydrosilyl groups/total molar number of the alkenyl groups=0.500/0.500=1.00). After completion of the dropwise addition, the mixture was heated to 100° C. and aged for 6 hours. Then, toluene was evaporated from the reaction solution under reduced pressure to give 610 g of Resin 4. The Mw of Resin 4 was 49,500. Incidentally, the siloxane amount contained in Resin 4 was 79 mass %.

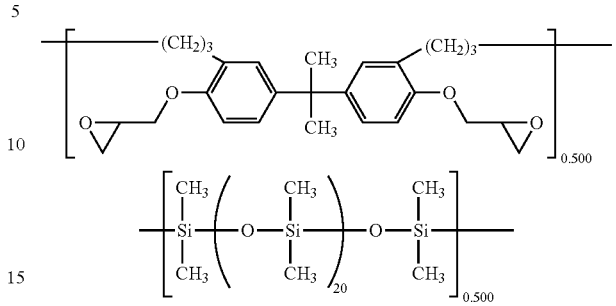

Synthesis Example of Resin 5

Into a 3 L flask equipped with a stirrer, a thermometer, a nitrogen inflow instrument, and a reflux condenser, 420.5 g (1.000 mol) of Compound S-8 was introduced. Then, 1,400 g of toluene was added thereto, and the mixture was heated to 70° C. Subsequently, 1.0 g of solution of chloroplatinic acid in toluene (platinum concentration of 0.5 mass %) was introduced, and 194.4 g (1.000 mol) of Compound S-4 was added dropwise over 1 hour (total molar number of the hydrosilyl groups/total molar number of the alkenyl groups=1.000/1.000=1.00). After completion of the dropwise addition, the mixture was heated to 100° C. and aged for 6 hours. Then, toluene was evaporated from the reaction solution under reduced pressure to give 570 g of Resin 5. The Mw of Resin 5 was 53,200. Incidentally, siloxane was not contained in Resin 5.

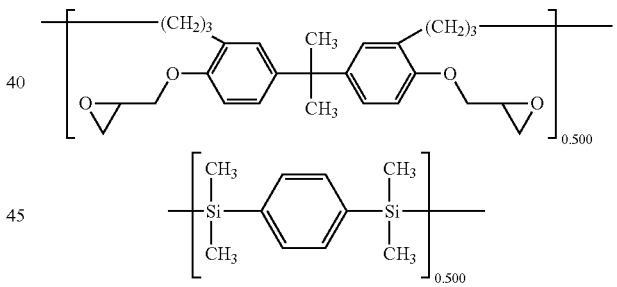

[2] Production of Resin Films

Examples 1 to 20 and Comparative Examples 1 to 16

In accordance with the compositions described in the following Tables 1 to 4, (A) the epoxy resin synthesized in Synthesis Example 5 (Resin 5) or the silicone-modified epoxy resin synthesized in Synthesis Examples 1 to 4 (Resins 1 to 4), (B) Epoxy compounds (1) to (2), (C) Epoxy compound (3), (D) a phenolic curing agent, (E) a curing accelerator, and (F) an inorganic filler were formulated. Additionally, cyclopentanone was added in an amount to make the solid content 65 mass %, and these were mixed and dispersed by stirring with a stirrer or a homomixer to prepare each dispersion of resin composition. The phenolic curing agent (D) was added in such an amount that the equivalent amount of phenol is as same as the equivalent amount of the epoxy groups contained in the component (A) and the epoxy groups contained in the components (B) and (C).

Each resin composition was applied onto a protective film using a die coater as a film coater and E7304 (trade name, polyester manufactured by Toyobo Co., Ltd., thickness: 75 μm, peel strength: 200 mN/50 mm) as a protective film. Then, this was kept in an oven set to 100° C. for 30 minutes to evaporate the solvent completely, thereby forming a resin film with a film thickness of 100 μm on the protective film.

The following shows each component used for preparing the resin composition other than those described above.

Epoxy Compound

Epoxy compound (3)

Epoxy compound (3)

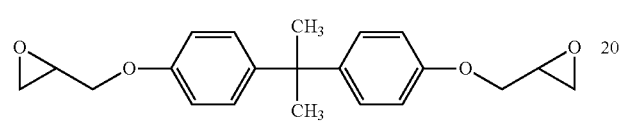

[Phenolic curing agents]

Phenol compound (1)

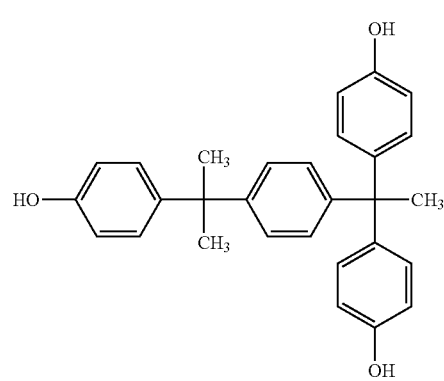

Phenol compound (2)

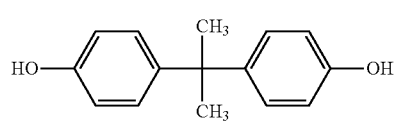

Phenol compound (3)

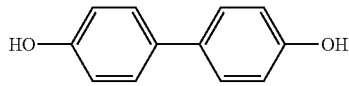

Curing Accelerator

Curezol 2P4MHZ (Trade Name) (Product of Shikoku Chemical Corporation, 2-phenyl-4-methyl-5-hydroxymethylimidazole)

Inorganic Filler

Silica (Product of Admatechs Co., Ltd., Average Particle size: 5.0 μm)

[3] Evaluation of Resin Films

The obtained resin films were evaluated by the following methods. The results are shown in Tables 1 to 4.

Method for Measuring Tensile Strength

The tensile elastic modulus, strength, and elongation were measured on each cured film produced as described above using a tensile strength measuring apparatus (autograph AGS-5kNG manufactured by Shimadzu Corporation). The conditions for curing the resin film was 180° C. for 4 hours.

Method for Testing Adhesion

Each produced film was stuck on a 20 mm square silicon wafer, and a silicon chip cut into 2 mm square was put threreonto, followed by heat curing (180° C. for 4 hours). Subsequently, the adhesion strength was measured when the chip was repelled from the side using an adhesion strength measuring apparatus (universal bondtester series 4000 (DS-100) manufactured by Nordson Advanced Technology K.K.) (die shear test).

Method for Testing Warping Stress

Each produced film was laminated on a silicon wafer with a film laminator (TAKATORI TEAM-100), followed by heat curing (180° C. for 4 hours). Then, the warping stress was measured on these samples with a thin film stress determination device manufactured by Toho Technology Corporation (FLX-2320-S).

TABLE 1

| | Run | Examples | | | | | | | | | |
|---|---|---|---|---|---|---|---|---|---|---|---|
| | | 1 | 2 | 3 | 4 | 5 | 6 | 7 | 8 | 9 | 10 |
| A | Resin 1 | 100 | | | | | | | | | |
| | Resin 2 | | 100 | | | | | 100 | 100 | 100 | 100 |
| | Resin 3 | | | 100 | | | | | | | |
| | Resin 4 | | | | 100 | | | | | | |
| | Resin 5 | | | | | 100 | 100 | | | | |
| B | Epoxy compound (1) | 5.0 | 5.0 | 5.0 | 5.0 | 5.0 | 1.0 | 2.5 | | 2.5 | 2.5 |
| | Epoxy compound (2) | | | | | | | 2.5 | 5.0 | 2.5 | 2.5 |
| C | Epoxy compound (3) | 5.0 | 5.0 | 5.0 | 5.0 | 5.0 | 1.0 | 5.0 | 5.0 | 5.0 | 5.0 |
| D | Phenol compound (1) | 22.6 | 17.2 | 9.2 | 22.1 | 53.5 | 47.5 | 16.9 | 16.6 | | |
| | Phenol compound (2) | | | | | | | | | 11.1 | |
| | Phenol compound (3) | | | | | | | | | | 13.6 |
| E | 2P4MHZ | 1 | 1 | 1 | 1 | 1 | 1 | 1 | 1 | 1 | 1 |
| F | silica | | | | | | | | | | |
| G | cyclopentanone | 33 | 32 | 30 | 33 | 41 | 38 | 32 | 32 | 31 | 31 |
| | silica content [mass %] | 0% | 0% | 0% | 0% | 0% | 0% | 0% | 0% | 0% | 0% |
| | Tensile elastic modulus [MPa] | 430 | 390 | 260 | 370 | 510 | 480 | 400 | 420 | 370 | 330 |
| | Tensile strength [MPa] | 8.8 | 8.7 | 8.9 | 7.5 | 8.9 | 8.0 | 9.0 | 9.2 | 8.5 | 8.5 |

TABLE 1-continued

|  | | | | | Examples | | | | | |
| --- | --- | --- | --- | --- | --- | --- | --- | --- | --- | --- |
| Run | 1 | 2 | 3 | 4 | 5 | 6 | 7 | 8 | 9 | 10 |
| Elongation [%] | 2.5 | 2.7 | 3.0 | 3.0 | 1.2 | 1.2 | 2.5 | 2.3 | 1.9 | 2.3 |
| Adhesion strength [MPa] | 14.4 | 13.3 | 10.4 | 10.5 | 16.7 | 16.9 | 14.7 | 14.8 | 12.4 | 16.9 |
| Stress [MPa] | 11.4 | 10.2 | 10.1 | 9.3 | 12.8 | 11.1 | 11.5 | 11.8 | 12.1 | 12.5 |

TABLE 2

|  | | | | | | | Examples | | | | | |
| --- | --- | --- | --- | --- | --- | --- | --- | --- | --- | --- | --- | --- |
|  | Run | 11 | 12 | 13 | 14 | 15 | 16 | 17 | 18 | 19 | 20 |
| A | Resin 1 | 100 | | | | | | | | | |
|  | Resin 2 | | 100 | | | | | 100 | 100 | 100 | 100 |
|  | Resin 3 | | | 100 | | | | | | | |
|  | Resin 4 | | | | 100 | | | | | | |
|  | Resin 5 | | | | | 100 | 100 | | | | |
| B | Epoxy compound (1) | 5.0 | 5.0 | 5.0 | 5.0 | 5.0 | 1.0 | 2.5 | | 2.5 | 2.5 |
|  | Epoxy compound (2) | | | | | | | 2.5 | 5.0 | 2.5 | 2.5 |
| C | Epoxy compound (3) | 5.0 | 5.0 | 5.0 | 5.0 | 5.0 | 1.0 | 5.0 | 5.0 | 5.0 | 5.0 |
| D | Phenol compound (1) | 22.6 | 17.2 | 9.2 | 22.1 | 53.5 | 47.5 | 16.9 | 16.6 | | |
|  | Phenol compound (2) | | | | | | | | | 11.1 | |
|  | Phenol compound (3) | | | | | | | | | | 13.6 |
| E | 2P4MHZ | 1 | 1 | 1 | 1 | 1 | 1 | 1 | 1 | 1 | 1 |
| F | silica | 980 | 940 | 881 | 976 | 1207 | 1104 | 938 | 936 | 895 | 914 |
| G | cyclopentanone | 278 | 267 | 250 | 277 | 343 | 314 | 266 | 266 | 254 | 260 |
|  | silica content [mass %] | 88% | 88% | 88% | 88% | 88% | 88% | 88% | 88% | 88% | 88% |
|  | Tensile elastic modulus [MPa] | 4600 | 4300 | 3800 | 4100 | 5000 | 4700 | 4300 | 4500 | 4000 | 3700 |
|  | Tensile strength [MPa] | 15.5 | 15.0 | 16.3 | 15.2 | 15.8 | 15.2 | 16.4 | 17.5 | 17.8 | 18.1 |
|  | Elongation [%] | 0.9 | 1.1 | 1.2 | 1.3 | 0.6 | 0.8 | 1.4 | 1.3 | 1.0 | 1.3 |
|  | Adhesion strength [MPa] | 16.6 | 15.7 | 15.5 | 14.0 | 19.2 | 18.8 | 15.8 | 16.0 | 15.4 | 17.9 |
|  | Stress [MPa] | 5.3 | 4.8 | 5.2 | 5.1 | 7.1 | 5.9 | 5.4 | 5.6 | 5.6 | 6.4 |

TABLE 3

|  | | | | | Comparative Examples | | | | | |
| --- | --- | --- | --- | --- | --- | --- | --- | --- | --- | --- |
|  | Run | 1 | 2 | 3 | 4 | 5 | 6 | 7 | 8 |
| A | Resin 1 | 100 | | | | | | | |
|  | Resin 2 | | 100 | | | | 100 | 100 | 100 |
|  | Resin 3 | | | 100 | | | | | |
|  | Resin 4 | | | | 100 | | | | |
|  | Resin 5 | | | | | 100 | | | |
| B | Epoxy compound (1) | 10.0 | 10.0 | 10.0 | 10.0 | 10.0 | 5.0 | 5.0 | 5.0 |
|  | Epoxy compound (2) | | | | | | 5.0 | 5.0 | 5.0 |
| C | Epoxy compound (3) | | | | | | | | |
| D | Phenol compound (1) | 21.9 | 16.4 | 8.4 | 21.3 | 52.8 | 15.8 | | |
|  | Phenol compound (2) | | | | | | | 10.4 | |
|  | Phenol compound (3) | | | | | | | | 12.8 |
| E | 2P4MHZ | 1 | 1 | 1 | 1 | 1 | 1 | 1 | 1 |
| F | silica | | | | | | | | |
| G | cyclopentanone | 33 | 32 | 30 | 33 | 41 | 32 | 30 | 31 |
|  | silica content [mass %] | 0% | 0% | 0% | 0% | 0% | 0% | 0% | 0% |
|  | Tensile elastic modulus [MPa] | 450 | 400 | 280 | 390 | 540 | 440 | 390 | 370 |
|  | Tensile strength [MPa] | 9.0 | 8.8 | 9.1 | 7.7 | 9.2 | 9.3 | 8.8 | 8.9 |
|  | Elongation [%] | 2.5 | 2.8 | 3.1 | 3.0 | 1.2 | 2.6 | 2.2 | 2.9 |
|  | Adhesion strength [MPa] | 14.9 | 13.2 | 11.4 | 10.9 | 17.9 | 14.9 | 11.7 | 17.3 |
|  | Stress [MPa] | 15.4 | 13.6 | 13.9 | 12.8 | 17.1 | 14.6 | 15 | 16.6 |

TABLE 4

|  | | | | Comparative Examples | | | | |
| --- | --- | --- | --- | --- | --- | --- | --- | --- |
|  | Run | 9 | 10 | 11 | 12 | 13 | 14 | 15 | 16 |
| A | Resin 1 | 100 | | | | | | | |
|  | Resin 2 | | 100 | | | | 100 | 100 | 100 |
|  | Resin 3 | | | 100 | | | | | |

TABLE 4-continued

| | | Comparative Examples | | | | | | | |
|---|---|---|---|---|---|---|---|---|---|
| | Run | 9 | 10 | 11 | 12 | 13 | 14 | 15 | 16 |
| | Resin 4 | | | | 100 | | | | |
| | Resin 5 | | | | | 100 | | | |
| B | Epoxy compound (1) | 10.0 | 10.0 | 10.0 | 10.0 | 10.0 | 5.0 | 5.0 | 5.0 |
| | Epoxy compound (2) | | | | | | 5.0 | 5.0 | 5.0 |
| C | Epoxy compound (3) | | | | | | | | |
| D | Phenol compound (1) | 21.9 | 16.4 | 8.4 | 21.3 | 52.8 | 15.8 | | |
| | Phenol compound (2) | | | | | | | 10.4 | |
| | Phenol compound (3) | | | | | | | | 12.8 |
| E | 2P4MHZ | 1 | 1 | 1 | 1 | 1 | 1 | 1 | 1 |
| F | silica | 967 | 927 | 868 | 963 | 1194 | 923 | 883 | 900 |
| G | cyclopentanone | 275 | 263 | 247 | 274 | 339 | 262 | 251 | 256 |
| | silica content [mass %] | 88% | 88% | 88% | 88% | 88% | 88% | 88% | 88% |
| | Tensile elastic modulus [MPa] | 4900 | 4500 | 4000 | 4400 | 5500 | 4900 | 4400 | 4400 |
| | Tensile strength [MPa] | 16.2 | 15.6 | 16.6 | 15.5 | 16.5 | 17.8 | 17.7 | 18.0 |
| | Elongation [%] | 1.0 | 1.3 | 1.4 | 1.4 | 0.5 | 1.4 | 1.1 | 1.6 |
| | Adhesion strength [MPa] | 17.0 | 15.1 | 15.0 | 14.2 | 20.0 | 15.9 | 14.1 | 17.2 |
| | Stress [MPa] | 8.3 | 7.5 | 7.7 | 7.5 | 9.3 | 7.7 | 7.8 | 7.8 |

As shown in the above results, the resin films obtained from the inventive resin compositions exhibited largely reduced warping stress compared to the resin films in Comparative Examples obtained from the compositions that did not contain the component (C), while there was no big difference from each other in strength and adhesion strength, when Table 1 and Table 3 in which silica was not contained are compared, or Table 2 and Table 4 in which silica was contained are compared. From these features, it is concluded that films for semiconductor encapsulation using the inventive resin composition exhibits smaller warpage and hardly causes crack and peeling.

The inventive resin composition, combining an epoxy compound in a particular structure having allyl groups and an epoxy compound without having an allyl group appropriately, makes it possible to largely improve the strength, the adhesion, and the warping stress of the cured material. Accordingly, the inventive resin composition is capable of exhibiting favorable crack resistance, reduced tendency for warping, and resistivity to peeling on a wafer having a chip mounted thereon when it is used for film-form molding material, for example.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

The invention claimed is:

1. A resin composition comprising:
(A) an epoxy resin;
(B) an epoxy compound shown by the following formula (1) and/or formula (2);
(C) an epoxy compound shown by the following formula (3);
(D) a phenolic curing agent; and
(E) a curing accelerator,

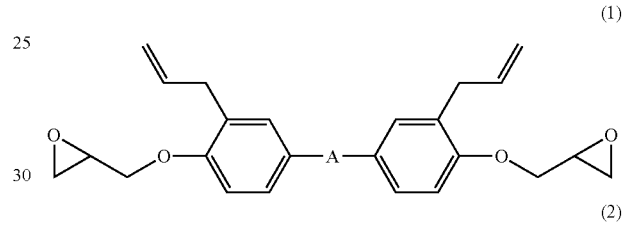

(1)

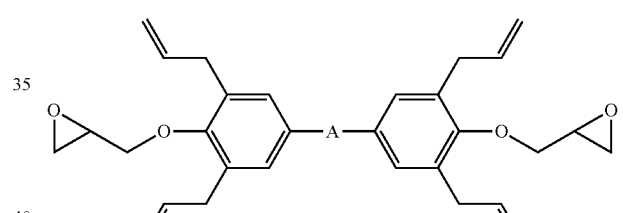

(2)

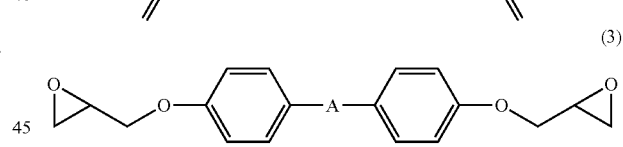

(3)

wherein "A" represents a single bond or a divalent organic group selected from the following formulae.

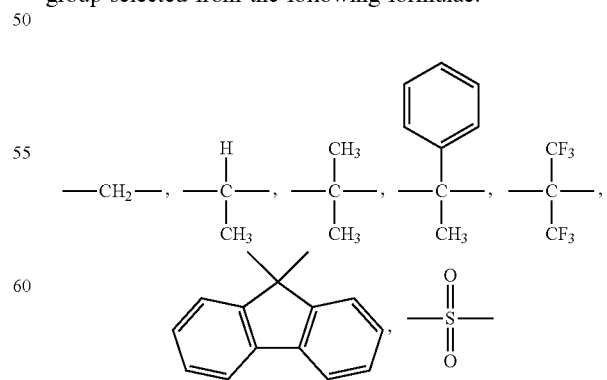

2. The resin composition according to claim 1, wherein the component (A) is a silicone-modified epoxy resin.

3. The resin composition according to claim 2, wherein the silicone-modified epoxy resin is shown by the following formula (4) and has a weight-average molecular weight of 3,000 to 500,000,

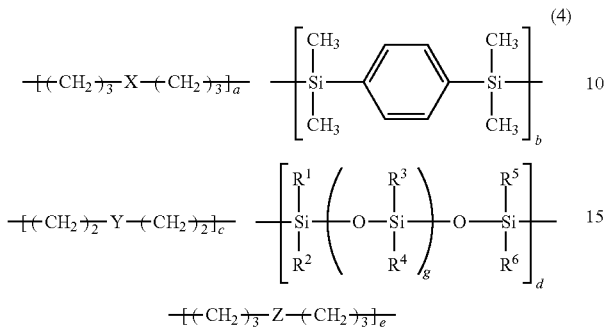

wherein, $R^1$ to $R^6$ each independently represent a monovalent hydrocarbon group or an alkoxy group having 1 to 20 carbon atoms, which is the same or different; "a", "b", "c", "d", and "e" represent a composition ratio of each repeating unit, and are positive numbers satisfying $0<a<1$, $0\leq b\leq 1$, $0\leq c<1$, $0<d<1$, $0\leq e<1$, $0.67\leq (b+d)/(a+c+e)\leq 1.67$, and $a+b+c+d+e=1$; "g" is an integer of 0 to 300; X represents a divalent organic group shown by the following formula (5); Y represents a divalent group containing a siloxane skeleton shown by the following formula (6); Z represents a divalent organic group shown by the following formula (7),

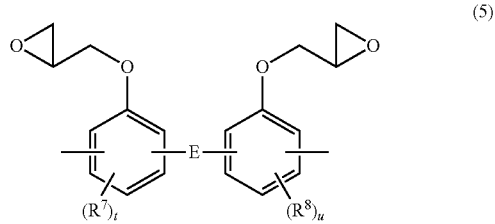

wherein E represents a single bond or a divalent organic group selected from the following formulae,

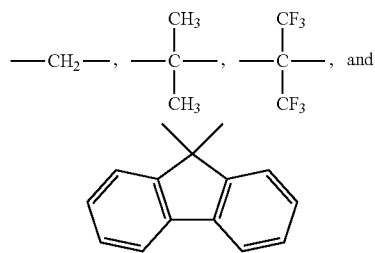

$R^7$ and $R^8$ each represent a monovalent hydrocarbon group or an alkoxy group having 1 to 20 carbon atoms, which is the same or different, "t" and "u" are each independently an integer of 0 to 2;

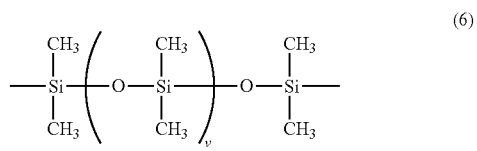

wherein "v" is an integer of 0 to 300;

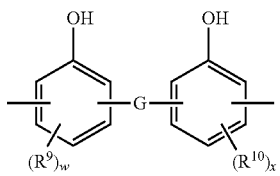

wherein G represents a single bond or a divalent organic group selected from the following formulae,

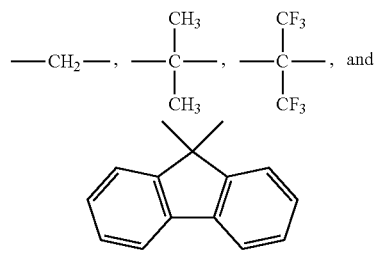

$R^9$ and $R^{10}$ each represent a monovalent hydrocarbon group or an alkoxy group having 1 to 20 carbon atoms, which is the same or different, "w" and "x" are each independently an integer of 0 to 2.

4. The resin composition according to claim 1, wherein the resin composition exhibits a tensile strength of 6.0 MPa or more after being cured.

5. The resin composition according to claim 2, wherein the resin composition exhibits a tensile strength of 6.0 MPa or more after being cured.

6. The resin composition according to claim 3, wherein the resin composition exhibits a tensile strength of 6.0 MPa or more after being cured.

7. The resin composition according to claim 1, wherein the component (B) is contained in an amount of 0.5 to 100 parts by mass based on 100 parts by mass of the component (A).

8. The resin composition according to claim 2, wherein the component (B) is contained in an amount of 0.5 to 100 parts by mass based on 100 parts by mass of the component (A).

9. The resin composition according to claim 1, further comprising (F) an inorganic filler.

10. The resin composition according to claim 9, wherein the inorganic filler is silica and is contained in an amount of 20 to 96 mass % in the resin composition.

11. A resin film composed of the resin composition according to claim 1.

12. A resin film composed of the resin composition according to claim 2.

13. A resin film composed of the resin composition according to claim 3.

14. A resin film composed of the resin composition according to claim 4.

15. A resin film composed of the resin composition according to claim 7.

16. The resin film according to claim 11, wherein the resin film exhibits a tensile strength of 6.0 MPa or more after being cured.

17. A semiconductor laminate comprising a cured material of the resin film according to claim 11 on a semiconductor wafer.

18. A semiconductor device, characterized in that the semiconductor laminate according to claim 17 is diced into each piece.

19. A method for manufacturing a semiconductor laminate, comprising the steps of:
   bonding the resin film according to claim 11 on a semiconductor wafer to mold the semiconductor wafer; and
   heat curing of the resin film.

20. A method for manufacturing a semiconductor device, comprising the step of dicing the semiconductor laminate manufactured by the method for manufacturing a semiconductor laminate according to claim 19 into each piece.

\* \* \* \* \*